(12) United States Patent
Kameyama et al.

(10) Patent No.: US 8,698,981 B2
(45) Date of Patent: *Apr. 15, 2014

(54) POLARIZER, OPTICAL FILM USING THE SAME, AND IMAGE DISPLAY DEVICE USING THE SAME

(75) Inventors: Tadayuki Kameyama, Ibaraki (JP);
Hiroaki Mizushima, Ibaraki (JP);
Youichirou Sugino, Ibaraki (JP);
Morimasa Wada, Ibaraki (JP)

(73) Assignee: Nitto Denko Corporation, Ibaraki-shi (JP)

( * ) Notice: Subject to any disclaimer, the term of this patent is extended or adjusted under 35 U.S.C. 154(b) by 219 days.

This patent is subject to a terminal disclaimer.

(21) Appl. No.: 12/230,372

(22) Filed: Aug. 28, 2008

(65) Prior Publication Data

US 2009/0002608 A1 Jan. 1, 2009

Related U.S. Application Data

(63) Continuation of application No. 10/522,187, filed as application No. PCT/JP03/09367 on Jul. 24, 2003.

(30) Foreign Application Priority Data

Jul. 24, 2002 (JP) ................................ 2002-215855

(51) Int. Cl.
*G02F 1/1335* (2006.01)
*G02B 5/30* (2006.01)

(52) U.S. Cl.
USPC ........................................ 349/96; 359/487.02

(58) Field of Classification Search
USPC ............................ 349/96; 359/487.01, 487.02
See application file for complete search history.

(56) References Cited

U.S. PATENT DOCUMENTS

| 4,025,688 | A | 5/1977 | Nagy et al. |
| 5,523,863 | A | 6/1996 | Fergason |
| 6,049,428 | A | 4/2000 | Khan et al. |
| 6,606,136 | B2 | 8/2003 | Matsumoto et al. |
| 7,006,174 | B2* | 2/2006 | Kusumoto et al. .............. 349/96 |
| 2001/0033349 | A1* | 10/2001 | Honda et al. .................... 349/96 |
| 2001/0039319 | A1* | 11/2001 | Harita et al. ................... 526/319 |

(Continued)

FOREIGN PATENT DOCUMENTS

| CN | 1323999 A | 11/2001 |
| EP | 1 153 961 | 11/2001 |

(Continued)

OTHER PUBLICATIONS

Japanese Office Action, Japanese Patent Application No. 2003-278357 dated Nov. 4, 2008, with partial English translation.

(Continued)

*Primary Examiner* — Jessica M Merlin
(74) *Attorney, Agent, or Firm* — Westerman, Hattori, Daniels & Adrian, LLP

(57) ABSTRACT

A polarizer that can be used for forming a liquid crystal display or an electroluminescent display with less display irregularities and excellent display characteristics is provided. The polarizer contains a dichroic material in a matrix, and its in-plane retardation at a measurement wavelength providing no absorption is in a range of 950 to 1350 nm. The measurement wavelength is preferably a wavelength that the dichroic material provides no absorption, and it is 1000 nm, for example.

25 Claims, 4 Drawing Sheets

(56) References Cited

U.S. PATENT DOCUMENTS

| | | | |
|---|---|---|---|
| 2002/0001700 A1 | 1/2002 | Sanefuji et al. | |
| 2002/0113922 A1* | 8/2002 | Kusumoto et al. | 349/96 |
| 2002/0145801 A1 | 10/2002 | Tsuchimoto et al. | |

FOREIGN PATENT DOCUMENTS

| | | | | |
|---|---|---|---|---|
| EP | 1 160 591 | | 12/2001 | |
| JP | 3-503322 | | 7/1991 | |
| JP | 6-138319 | | 5/1994 | |
| JP | 6-347641 | | 12/1994 | |
| JP | 6-347641 | A | 12/1994 | |
| JP | 10-268294 | | 10/1998 | |
| JP | 10-268294 | A | 10/1998 | |
| JP | 2001091736 | A * | 4/2001 | G02B 5/30 |
| JP | 2001-228332 | | 8/2001 | |
| JP | 2001-228333 | | 8/2001 | |
| JP | 2001-311826 | | 11/2001 | |
| JP | 2001-315143 | A | 11/2001 | |
| JP | 2001311826 | A * | 11/2001 | G02B 5/30 |
| JP | 2001-343529 | | 12/2001 | |
| JP | 2000-28939 | | 1/2002 | |
| JP | 2002-028938 | A | 1/2002 | |
| JP | 2002-28939 | | 1/2002 | |
| JP | 2002-28939 | A | 1/2002 | |
| JP | 2002-169024 | | 6/2002 | |
| JP | 2002-328233 | | 11/2002 | |
| JP | 2002-333522 | | 11/2002 | |
| JP | 2002-333522 | A | 11/2002 | |
| JP | 2003-29040 | A | 1/2003 | |
| JP | 2003-172822 | A | 6/2003 | |
| KR | 2002-0079371 | A | 10/2002 | |

OTHER PUBLICATIONS

Korean Office Action dated Oct. 1, 2008 in corresponding Korean Patent Application No. 10-2005-7001313.
Official Action mailed Dec. 1, 2009 for corresponding Japanese patent application No. 2003-278357 with partial English translation.
Japanese Office Action dated Nov. 2, 2010, issued in corresponding Japanese Patent Application No. 2003-278357.
Chinese Office Action dated Jan. 20, 2011, issued in corresponding Chinese Patent Application No. 201010231663.6.
Japanese Office Action dated Aug. 13, 2012, issued in corresponding Japanese patent application No. 2010-019910, w/ partial English translation.
Korean Office Action dated Sep. 1, 2012, issued in corresponding Korean patent application No. 10-2012-7014356 w/ partial English translation.
Chinese Office Action dated Jul. 16, 2012, issued in corresponding Chinese patent application No. 201010231663.6, w/ partial English translation.

* cited by examiner

POLARIZER, OPTICAL FILM USING THE SAME, AND IMAGE DISPLAY DEVICE USING THE SAME

This application is a continuing application of U.S. application Ser. No. 10/522,187 filed Sep. 21, 2005, which is a 371 of PCT/JP03/09367 filed on Jul. 24, 2003.

TECHNICAL FIELD

The present invention relates to a polarizer, an optical film such as a polarizing plate using the same, and an image display device.

BACKGROUND ART

Liquid crystal displays (LCDs) have been used for desktop electronic calculators, electronic clocks, personal computers, word processors, and meters of automobiles and other machines. Such a liquid crystal display includes in general a polarizing plate for visualizing alignment changes of the liquid crystal, and the polarizing plate has a very large influence on the display characteristics of the liquid crystal display.

For the polarizing plate, typically for example, a polarizing plate made of a polarizer (polarizing film) of a polyvinyl alcohol-based film or the like by absorbing and aligning a dichroic material such as iodine and organic dye, whose surfaces are laminated with protective films of triacetylcellulose or the like. A polarizer for providing a liquid crystal display that is bright, good at color reproduction and excellent in display characteristics, is desired particularly.

However, in a case where particularly a backlight that emits polarized light is used in the liquid crystal display, there is a problem that a display irregularity occurs and uniformity in the contrast will deteriorate.

For solving the problems, for example, JP H14 (2002)-028939A discloses a polarizing plate using a polyvinyl alcohol-based polymer film that can be stretched uniformly in a simple manner.

DISCLOSURE OF INVENTION

However, there is a problem that realization of a high contrast for an image display device will be accompanied with a considerable display irregularity. For example, in a case where a liquid crystal mode is in a normally-black (a state applied with no voltage is a black display state), the influence will be considerable. Particularly, when viewed in directions of obliquely 30°, 40°, 60° or more, the display irregularity will be considerable. For this reason, currently, there exist needs for various display devices like liquid crystal displays that can suppress the display irregularity further and can exhibit uniform display characteristics.

A polarizer of the present invention is characterized as a polarizer containing a dichroic material in a matrix, and the in-plane retardation is in a range of 950 to 1350 nm at a measurement wavelength providing no absorption.

The inventors found that the retardation of the polarizer itself has a relationship with the above-mentioned display irregularity, and have studied to find that even a retardation variation in the polarizer will be difficult to see when the in-plane retardation at a measurement wavelength providing no adsorption is in a range of 950 to 1350 nm. That is, even when a blue variation (lightness and darkness of a blue) caused by a dyeing irregularity or the like is recognized in a polarizer, a polarizer exhibiting the in-plane retardation as in the present invention arranged in crossed Nicols will exhibit blue color, and thus the blue variation will be synchronized with the blue color of the retardation itself and thus the color irregularity may be difficult to recognize. Therefore, irrespective of variations in the retardation, a display irregularity (particularly, a display irregularity in a black display) can be cancelled sufficiently at a time of application to various image display devices, particularly, to a large-sized or high-contrast display device or a flat panel display.

BEST MODE FOR CARRYING OUT THE INVENTION

Figure 1:
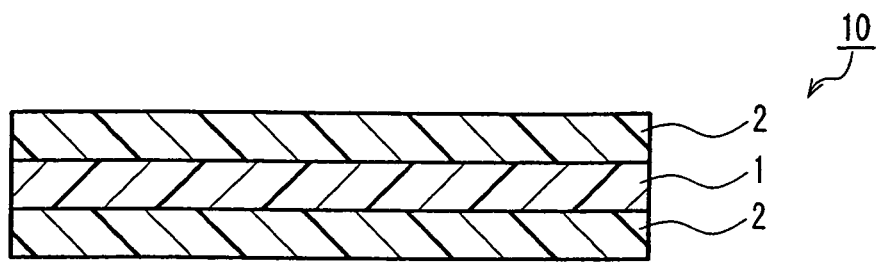
FIG. 1 is a cross-sectional view showing one example of an optical film of the present invention.

As mentioned above, the polarizer of the present invention is characterized as a polarizer containing a dichroic material in a matrix, and its in-plane retardation is in a range of 950 to 1350 nm at a measurement wavelength providing no absorption. It is preferable that the in-plane retardation is set in a range of 1050 to 1250 nm, more preferably, in a range of 1100 to 1200 nm. The in-plane retardation ($\Delta nd$) is expressed by the formula below, where nx and ny denotes respectively refractive indices in X-axis and Y-axis directions in the polarizer. The X-axis direction denotes an axial direction presenting a maximum refractive index within the plane of the polarizer, the Y-axis direction denotes an axial direction perpendicular to the X-axis within the plane, and d denotes a thickness of the polarizer.

$$\Delta nd = (nx - ny) \cdot d$$

For the in-plane retardation according to the present invention, for example, when the size of the polarizer is set in a range of (8 to 800 cm)×(15 to 1500 cm) and the retardation is measured at 28 to 1,200,000 measurement points in total provided at a pitch of 1 to 20 mm in longitudinally and transversely, preferably all the measurement values are within the above range. In a specific example, when the retardation is measured at 12276 measurement points in total with a pitch of 2 mm in a polarizer of 25 cm×20 cm, all the measurement values are preferably within the range.

The measurement wavelength is not limited particularly as long as the polarizer of the present invention does not provide absorption, i.e., the dichroic material does not provide absorption. For example, it is 800 to 1500 nm, preferably, 840 to 1200 nm, and particularly preferably, 1000 nm. At setting the measurement wavelength, for example, when the measurement wavelength is x (nm), a chromatic dispersion ΔRx represented by the formula below must be taken into consideration. Also, when the absorption edge is $x_a$, the x must be larger than the $x_a$.

$$\Delta R_\chi = \Delta R_{1000} \times \frac{R_\chi^{average}}{R_{1000}^{average}}$$

For the polarizer of the present invention, it is further preferable that a differential retardation fluctuation (σ) of the in-plane retardation is in a range of −5 nm/mm to 5 nm/mm. When the differential retardation fluctuation (σ) is in the range, for example, there is an effect that a high uniformity is presented particularly in a large-screen display such as a LCD TV The differential retardation fluctuation (σ) is, more preferably, in a range of −4 nm to 4 nm/mm, and particularly preferably, in a range of −2.5 nm/mm to 2.5 nm/mm.

The above-mentioned 'differential retardation fluctuation (σ)' is calculated on the basis of a difference ($\Delta R=R_i-R_{i+1}$) between retardations ($R_i$, $R_{i+1}$) at two measurement points (i, i+1) and a distance d (mm) between the two measurement points, and expressed as a σ=ΔR/d.

The distance between the measurement points is preferably 1 to 100 mm, or more preferably, 3 to 70 mm from an aspect of precisely calculating retardation fluctuations occurring locally.

For the polarizer of the present invention, when the in-plane retardation shows maximum and minimum values respectively at a measurement wavelength providing no absorption, a distance between a measurement position exhibiting the maximum value and a measurement position exhibiting the minimum value is, for example, not more than 10 mm (more than 0) or not less than 100 mm, and a difference between the maximum value and the minimum value (in-plane retardation variation) is less than 60 nm. Preferably, the distance is not more than 7 mm or not less than 120 mm and the in-plane retardation variation is less than 45 nm, more preferably, the distance is not more than 5 mm or not less than 150 mm and the in-plane retardation variation is less than 45 nm. When the distance is short as 10 mm or less, since the maximum value and the minimum value get close extremely to each other, the retardation variation will be difficult to recognize. Particularly, since the variation in the in-plane retardation will be decreased and the retardation variation of the polarizer will be further difficult to recognize when the distance is increased, a further preferred distance is 100 mm or more, and a particularly preferred distance is 150 mm or more. The upper limit of the distance is not limited, but it corresponds to a size of the film.

The polarizer of the present invention will be used, for example, to a polarizing plate and an optical film, and further it can be used for various image display devices such as liquid crystal displays. Therefore, it can be a polarizer that is cut out previously (so-called 'chip-cut') corresponding to a size or the like of liquid crystal cells.

The polarizer of the present invention can be manufactured, for example, by subjecting a polymer film to a swelling treatment, a dyeing treatment by using a dichroic material, a crosslinking treatment, a stretching treatment, a washing treatment or the like, as described below. The present invention is characterized in that a selection of the in-plane retardation for the polarizer of the above-mentioned range, while persons skilled in the art can produce such a polarizer having the in-plane retardation, on the basis of common knowledge in the art at the time of the application.

(Polymer Film)

For the polymer film, a conventionally known film can be used without any particular limitations. The examples include hydrophilic polymer films such as a polyvinyl alcohol (PVA)-based film, a partially-formalized PVA-based film, a polyethylene terephthalate (PET)-based film, a film based on ethylene-vinyl acetate copolymer, and partially-saponified films thereof. Alternatively for example, polyene-alignment films of dehydrated PVA and dehydrochlorinated polyvinyl chloride, and a polyvinylene-based film that is stretch-aligned can be used as well. Among them, the PVA-based film is preferred, as it has an excellent dye-affinity provided by iodine as a dichroic material. Hereinafter, a length in a stretching direction for a polymer film is regarded as 'length' and a length perpendicular to the stretching direction is regarded as 'width'.

It is preferable that the PVA film has a polymerization degree of, for example, ranging from 1700 to 4500, more preferably from 2400 to 4000, and the saponification degree is preferably in a range of 18 to 50%, and more preferably, in a range of 23 to 47%. It is also preferable that the glycerol content of the film is in a range of 7 to 20 wt % for example, more preferably, in a range of 8 to 18 wt %.

Though there is no particular limitation, it is preferable that the thickness of the polymer film is, for example, in a range of 65 to 80 μm, more preferably, 70 to 85 μm.

It is preferable that the polymer film has a local thickness fluctuation of not more than 0.7 μm/cm with respect to an average thickness, more preferably, not more than 0.5 μm/cm, and particularly preferably, not more than 0.2 μm/cm. Even when the thickness fluctuation of the polymer film exceeds 0.7 μm/cm, influences of the thickness fluctuation can be avoided by, for example, optimizing the conditions of below-mentioned treatments such as swelling, crosslinking and stretching, or by controlling the drainage.

The expression that 'a local thickness fluctuation is not more than 0.7 μcm with respect to an average thickness' indicates that, for example, a thickness fluctuation between two points separated from each other by 1 to 100 mm, i.e., '(difference in thickness between the two points)/(distance between the two points)' is not more than 0.7 μm/cm. Though there is no particular limitation for the average thickness, for example, a PVA-based film having a maximum width of 2600 mm can be measured at 2600 points. The present invention is not restricted thereto.

For the polymer film, it is preferable, for example, to use a film that has less swelling variation in the next step of swelling treatment, i.e., a film that has less thickness variation caused by the swelling. Thereby, variations in retardation, content of the dichroic material and transmittance can be decreased further for the thus produced polarizer. For this purpose, for example, it is preferable to use a polymer film having less irregularities in the crystallization degree and thickness, and less variation in the water content. A polymer film with substantially no variation in the glycerol content is preferred as well.

(2) Swelling Treatment

The polymer film (untreated film) is impregnated to swell in a swelling bath and also stretched in the swelling bath.

For the swelling bath, for example, water, an aqueous solution of glycerol, an aqueous solution of potassium iodide or the like, can be used. Though the swelling treatment can be carried out as in a conventional technique without any particular limitations for the conditions, for example, the impregnation can be carried out for 60 seconds to 300 seconds (preferably, 90 to 240 seconds, and more preferably, 120 to 180 seconds) in a swelling bath of 20 to 30° C. When the swelling time is 60 seconds or more, for examples, since contamination of a dyebath in the following dyeing step can be avoided sufficiently, problems in the long-run can be reduced, and the dyeing irregularity can be prevented sufficiently. Also, when the swelling time is not more than 300 seconds, ruptures which may occur at the time of stretching in a subsequent stretching step can be suppressed sufficiently.

As a result of impregnating in the swelling bath, the polymer film is swelled in general 1.1 to 1.5 times the length of the untreated film. It is further preferable that the film is stretched to swell further to 1 to 1.3 times (preferably, 1.05 to 1.25 times) the length of the swelled film.

In the case of reducing the stretch rate and increasing the impregnation time in the swelling step, for smoothing out wrinkles in the film, it is preferable to provide a roll such as an expander roll, a spiral roll, and a crown roll in the swelling bath, for example. Particularly, when the untreated film is wide (for example, when the width exceeds about 3 m), it is preferable to set a roll for removing wrinkles in the center of the untreated film.

As mentioned above, it is preferable that the polymer film has less variation in the swelling. Specifically, the thickness variation after the swelling is preferred to be 8% or less, more preferably, 5% or less, and particularly preferably, 2.5% or less. The reason is that, when the polymer film is swelled, variation in the thickness will result in differences in the swelling and in the stretching caused by the swelling. Specifically, it is considered that when the thickness is decreased, the film will be stretched more by the swelling, while the film will not be stretched so much when the thickness is increased. In this manner, since a thin part of the film will be swelled more in the film, the film is preferably swelled gradually for saturation.

In the film, it is also preferable that a difference between a maximum value and a minimum value of the thickness is in the relationship below with a distance between a position exhibiting the maximum value and a position exhibiting the minimum value. That is, '(difference between maximum value and minimum value)/(distance)' is not more than 1.5 μm/cm for example, preferably not more than 1.0 μm/cm, more preferably, 0.5 μm/cm. It is particularly preferable that the distance is not more than 5 mm or not less than 250 mm, more preferably, not more than 10 mm or not less than 150 mm, and particularly preferably, not more than 20 mm or not less than 100 mm. In this manner, for example, in a stretching treatment or drying treatment as mentioned below, a slight stretch at a position exhibiting a minimum thickness in a direction (TD direction) perpendicular to the stretching direction, which is caused by shrinkage at the position exhibiting the maximum thickness, can be prevented sufficiently. When the distance is not more than 10 mm, dyeing irregularity can be inconspicuous further because of the short distance. When the distance is 250 mm or more, stretching at the position having the maximum value and the position having the minimum value can be carried out slowly, which can serve to prevent sufficiently the above-mentioned stretching in the perpendicular direction accompanying the shrinkage.

(2) Dyeing Treatment

The polymer film is pulled out of the swelling bath, impregnated, for example, in a dyebath containing a dichroic material, and further stretched uniaxially in the dyebath. That is, the polymer film is impregnated for adsorbing the dichroic material and the stretching carried out for aligning the dichroic material in one direction.

Any of well-known materials can be used for the well-known dichroic material. The examples include iodine and organic dyestuffs. The organic dyestuff can be used preferably in a state combined with at least one of other dyestuffs for neutralization of the visible ray region.

The solution for the dyebath can be a solution prepared by dissolving the dichroic material in a solvent. For example, water can be used for the solvent, and an organic solvent compatible with water can be included further. Though the concentration of the dichroic material in the solution is not limited particularly, preferably it ranges from 0.005 to 10 wt %, and preferably from 0.01 to 0.08 wt %.

Though the time of impregnation of the polymer film in the dyebath is not limited particularly, for example, it ranges from 30 to 120 seconds, preferably from 40 to 110 seconds, and more preferably from 50 to 100 seconds. The temperature for the dyebath is typically from 10 to 35° C.

The stretch rate in the dyeing treatment is, for example, preferably in a range of 2 to 3.2 times with respect to the length of the polymer film before swelling (untreated film), more preferably, from 2.2 to 3.1 times, and particularly preferably, from 2.4 to 3.0 times. When the stretch rate is 2 or more, for example, waving in the stretching direction (MD direction) of the film can be suppressed sufficiently, and thus the problem of a dye irregularity can be prevented. When the rate is 3.2 or less, a sufficient polarization degree can be maintained.

Since wrinkles in the polymer film may result in a dye irregularity, any of the above-mentioned various rolls can be arranged in the dyebath, thereby removing the wrinkles in the polymer film. Alternatively, the wrinkles can be removed by the rolls before or after impregnating the polymer film in the dyebath.

(3) Crosslinking Treatment

The polymer film is pulled out from the dyebath, impregnated in a crosslinking bath containing a crosslinking agent, and further stretched in the crosslinking bath. The crosslinking treatment is performed to retain the running stability.

The crosslinking agent can be selected from known materials like boron compounds such as boric acid and borax, glyoxal, and glutaraldehyde. These materials can be used alone or can be combined with at least any one of the remaining materials. The solution for the crosslinking bath can be a solution prepared by dissolving the crosslinking agent in a solvent. In an example, the solvent can be water, and it can further contain an organic solvent compatible with water.

Though the concentration of the crosslinking agent in the solution is not limited particularly, preferably, it ranges from 1 to 10 wt %, more preferably from 1.5 to 8 wt %. When the crosslinking agent is boric acid, for example, the range is 1.5 to 7 wt %, preferably 2 to 6 wt %.

In order to provide in-plane homogeneous properties to the polarizer, the aqueous solution can contain an auxiliary of iodide such as potassium iodide, lithium iodide, sodium iodide, zinc iodide, aluminum iodide, lead iodide, copper iodide, barium iodide, calcium iodide, tin iodide, and titanium iodide, in addition to the boric acid compound. The content of the auxiliary in the solution is, for example, from 1 to 18 wt %, preferably from 2 to 18 wt %. When the auxiliary is potassium iodide, the range is 2 to 15 wt %, preferably, 5 to 14 wt %.

A combination of boric acid and potassium iodide is particularly preferred. A typical range for a ratio (weight ratio) of the boric acid to the potassium iodide in the solution is, for example, from 7:1 to 1:9, preferably, from 5:1 to 1:5.

Though there is no particular limitation, the temperature for the dyeing treatment and the temperature for the crosslinking treatment are in a relationship of '(dyeing temperature)<(crosslinking temperature)≤(stretching temperature)'. Specifically, a range from 8 to 75° C. is preferred, and a more preferable range is 20 to 70° C. Though the time for impregnating the polymer film is not limited particularly, it generally ranges from 25 to 150 seconds, preferably from 30 to 120 seconds.

The stretch rate in this crosslinking treatment is, for example, not more than 3.5 times, or preferably, not more than 3.3 times the length of the untreated film.

(4) Stretching Treatment

The polymer film is pulled out from the crosslinking bath, impregnated in a final stretching bath, and further stretched in this stretching bath. The crosslinking treatment and the stretching treatment can be repeated further.

Though the solution for the stretching bath is not limited particularly, it is selected, for example, from solutions containing boric acid, potassium iodide, various metal salts and other iodides, and zinc compounds. Examples of the solvent can be, water, ethanol, or the like.

Specifically, when boric acid is used, the concentration ranges typically from 2 to 10 wt %, preferably from 3 to 6 wt %. It is preferable that the boric acid concentration in the stretching bath is higher than the boric acid concentration in the crosslinking bath. It is also preferable to further use potassium iodide, and in such a case for example, it is preferable that the concentration is set higher than the concentration of the potassium iodide in the above-mentioned crosslinking bath. The concentration of the potassium iodide ranges typically from 4 to 10 wt %, and preferably from 6 to 8 wt %. It is preferable, for example, that the concentration of the potassium iodide in the stretching bath is set higher than the concentration of the potassium iodide in the above-mentioned crosslinking bath.

A typical range of the temperature of the stretching bath is from 40 to 75° C., preferably from 50 to 70° C.

The stretch rate in the stretching treatment ranges, for example, from 5.5 to 6.5 times, preferably from 5.8 to 6.4 times, and more preferably from 6.0 to 6.2 times the length of the untreated film.

For the time of the stretching treatment, for example, a range of 35 seconds to 60 seconds is preferable, and more preferable range is from 40 seconds to 50 seconds.

(5) Washing Treatment

The polymer film is pulled out of the stretching bath, impregnated in an iodide-containing solution, washed with water, and dried.

The above-described iodides can be used for the iodide-containing solution. Potassium iodide and sodium iodide or the like are especially preferred. In general, the solvent can be water. Residue of the boric acid used in the stretching treatment can be washed out from the polymer film by using the iodide-containing solution.

When the aqueous solution contains potassium iodide, the concentration ranges, for example, from 0.5 to 20 wt %, preferably from 1 to 15 wt %, and particularly preferably from 1.5 to 7 wt %. It is preferable that the temperature of the aqueous solution ranges from 15 to 40° C., more preferably from 20 to 35° C. The time for impregnating in the aqueous solution is typically 2 to 15 seconds, preferably 3 to 12 seconds. There is no particular limitation on the number of cycles for washing in water after the impregnation in the iodide-containing aqueous solution.

In this stage, it is preferable that the thus stretched polymer film is deformed so that the width and the thickness satisfy the conditions below. When the following conditions are satisfied, the neutralization of the thus produced polarizer of the present invention will be improved further. Specifically, when the polarizer of the present invention and a polarizing plate using the same are arranged in parallel Nicols, yellowish coloring can be suppressed further. When arranged in crossed Nicols, bluish or reddish coloring can be suppressed further.

Namely, in a case where a total stretch rate (rate to the length of an untreated film) of the performed stretching is regarded as 'a' (hereinafter, the same), it is preferable that the stretched polymer film is deformed to have a width ranging from $(1/\sqrt{a}\times100)$ % to $(1/\sqrt{a}\times125)$ % when the polymer film before swelling (untreated film) has a width of 100%, preferably from $(1/\sqrt{a}\times100)$ % to $(1/\sqrt{a}\times120)$ %, and more preferably from $(1/\sqrt{a}\times100)$ % to $(1/\sqrt{a}\times110)$ %. Specifically, when the stretch rate 'a' is 6, a preferable range is 41 to 51%, and more preferably 41 to 45%. The width of the polymer film denotes a length perpendicular to the stretch direction (longitudinal direction) as mentioned above.

When the stretched polymer film is not stretched uniformly for example, the thickness may be irregular. In such a case, it is preferable that the stretched polymer film is deformed so that a thickness at the thinnest part will range from $(1/\sqrt{a}\times80)$ % to $(1/\sqrt{a}\times100)$ %, preferably from $(1/\sqrt{a}\times85)$ % to $(1/\sqrt{a}\times100)$ %, and more preferably from $(1/\sqrt{a}\times90)$ % to $(1/\sqrt{a}\times100)$ % when the thickness of the untreated film is 100%, because it is preferable that Δn and further the thickness d are increased due to the high stretch rate. The thinnest part of the film tends to become thinner due to shrinkage in the width direction of the periphery and the other parts, and thus the uniaxiality may deteriorate and the optical characteristics will be degraded locally, which may cause a considerable irregularity.

Furthermore, it is preferable for the stretched polymer film that the width and the thickness satisfy the relationship expressed below. That is, a value expressed by the Formula (I) below is, for example, in a range of 0.9 to 1.1, or preferably in a range of 0.95 to 1.05.

$$(T_b \times W_b)/(T_a \times W_a) \quad (I)$$

$T_a$: average thickness of stretched polymer film
$T_b$: average thickness of unstretched polymer film (untreated film)
$W_a$: width of stretched polymer film
$W_b$: width of unstretched polymer film (untreated film)

(6) Drying Treatment

By drying the polymer film treated as mentioned above, the polarizer of the present invention, which contains a dichroic material in a matrix, can be produced. The drying is carried out, for example, by natural dry, air dry, heat dry or the like, without any particular limitations. In a case of heat dry, the temperature is typically 20 to 40° C., and preferably 22 to 35° C. The treatment time is typically 0.5 to 5 minutes, preferably 1 to 4 minutes, and more preferably, 1.5 to 3 minutes.

Though there is no particular limitation, the thickness of the finally-obtained polarizer of the present invention is preferably in a range of 5 to 40 μl, more preferably 15 to 35 μm, and particularly preferably 17 to 32 μm. The thickness of 5 μm or more serves to, for example, improve further the mechanical strength. The thickness of 40 μm or less will serve to improve further the optical characteristics, for example, the thickness can be reduced easily at the time of applying the film to a flat panel.

The polarizers are not limited to the ones mentioned above, but similar polarizers can be formed, for example, by mixing a dichroic material in PET or the like for forming a film to be stretched. Alternatively, a polarizer can be formed by stretch-aligning a polyvinylene-based film or by further kneading a dichroic material in the film. Alternative examples include an O-type polarizer (U.S. Pat. No. 5,523,863 and Tokuhyo-03 (1991)-503322 (published Japanese translation of PCT international publication for patent application)) where a dichroic dyestuff is mixed in a uniaxially-aligned liquid crystal and an E-type polarizer using a dichroic lyotropic liquid crystal (U.S. Pat. No. 6,049,428).

Next, an optical film of the present invention includes the polarizer of the present invention. Examples of the optical film are described below.

A first example of the optical film of the present invention is a polarizing plate that, for example, includes the polarizer of the present invention and a transparent protective layer, where the transparent protective layer is arranged on at least one surface of the polarizer. The transparent protective layer can be arranged on one of or both surfaces of the polarizer. When laminating on both the surfaces, the transparent protective layers can be the same type or different from each other.

When measuring the in-plane retardation of the polarizer of the polarizing plate, the measurement can be carried out in a state, for example, that the transparent protective layer is removed by using a solvent or the like from the polarizing plate of the present invention. When the retardation of the transparent protective layer is minor (substantially 0 nm), the polarizing plate with the transparent protective layer can be measured.

In the polarizing plate of the present invention, for example, since the width changes depending on the water content, the water content is preferably 2 to 5%, more preferably 2.5 to 4.5%, and particularly preferably 3 to 4%.

FIG. 1 shows a cross-sectional view of one example of the polarizing plate. As shown in this figure, a polarizing plate 10 includes a polarizer 1 and two transparent protective layers 2, where the transparent protective layers 2 are arranged respectively on both surfaces of the polarizer 1.

The transparent protective layers 2 can be selected from conventionally known transparent protective films without any particular limitations. Preferably, they are a polymer films excellent in some characteristics such as transparency, mechanical strength, thermal stability, moisture shielding property, and isotropism. Specific examples of materials for the transparent protective layers include cellulose-based resins such as triacetylcellulose, and transparent resins based on e.g., polyester, polycarbonate, polyamide, polyimide, polyethersulfone, polysulfone, polystyrene, acrylic, acetate, and polyolefin. Resins that will be cured by heat or ultraviolet rays, which is based on e.g., the above-mentioned acrylic, urethane, acrylic urethane, epoxy, and silicone, can be used as well. Materials having lower photoelastic coefficient, such as polynorbornene-based resin, are preferable as well.

In addition to the above examples, a film or the like made by extruding a mixture of an alternating copolymer of isobutene and N-methyl maleimide and a acrylonitrile-styrene copolymer as described in JP 2001-343529 (WO 01/37007) and JP 2002-328233 A, can be used as well. Such a film can be provided, for example, as described below. First, the alternating copolymer (100 weight parts) containing 50 mol % of N-methyl maleimide and the copolymer (67 weight parts) containing 27 wt % of acrylonitrile and 73 wt % of styrene are melt-kneaded, and the thus obtained pellet is fed to a melt-extruder having a T-die so as to produce a film of an untreated film. This film is subjected to a free-end vertical-uniaxial stretch under a condition of a stretch speed of 100 cm/min., stretch rate of 1.45, and a stretch temperature of 162° C. It is further subjected to a free-end uniaxial stretch under the same condition in a direction perpendicular to the above-mentioned stretching direction, so that a stretched film 49 μm in thickness is obtained. This stretched film has nx=1.548028, ny=1.548005, nz=1.547970, the in-plane retardation of 1.1 nm, thickness direction retardation of 2.8 nm, and the modulus of the photoelastic coefficient of $1.9 \times 10^{-13}$ cm$^2$/dyne.

Furthermore, these transparent protective films can have surfaces saponified by using alkali or the like. Among them, a TAC film is preferred from an aspect of the polarization characteristics, the durability or the like, and a TAC film with a saponified surface is more preferable.

It is preferable that the transparent protective layers are colorless, for example. Specifically, it is preferable that a retardation value (Rth) of the film in the thickness direction as represented by the following equation is in a range of −90 nm to +75 nm. More preferably, it is from −80 nm to +60 nm, and particularly preferably from −70 nm to +45 nm. When the retardation value is within the range of −90 nm to +75 nm, coloring (optical coloring) of the polarizing plate, which is caused by the protective film, can be solved sufficiently.

$$Rth=[\{(nx+ny)/2\}-nz]\cdot d$$

In the above-described equation, 'd' denotes a thickness of the transparent protective layer, while nx, ny and nz respectively denote refractive indices of X-axis, Y-axis and Z-axis in the transparent protective layer. The X-axis denotes an axial direction presenting a maximum refractive index within the transparent protective layer, the Y-axis denotes an axial direction perpendicular to the X-axis within the plane, and the Z-axis denotes a thickness direction perpendicular to the X-axis and the Y-axis.

Though the thickness of the transparent protective layer is not limited particularly, preferably it is not more than 500 μm for example, for the purpose of reducing thickness of the polarizing plate, preferably, ranging from 1 to 300 μm, and more preferably, from 5 to 300 μm.

The transparent protective layer can be treated to provide characteristics such as hard coating, antireflection, anti-sticking, diffusion and anti-glaring. Hard coating treatment is applied, for example, to prevent scratches on the surfaces of the polarizing plate. For example, a surface of the transparent protective layer is applied with a coating film of a cured resin with excellent hardness and smoothness. The cured resin can be selected from ultraviolet cured resins of silicone base, urethane base, acrylic base, and epoxy base. The treatment can be carried out in a conventionally known method.

Antireflection treatment may be applied to prevent reflection of external light on the surface of the polarizing plate, and carried out by forming such an anti-reflection film or the like in a conventionally known method. Anti-sticking treatment is carried out for prevention of sticking with adjacent layers.

When external light is reflected on the surface of the polarizing plate, the reflection will inhibit visibility of light transmitted through the polarizing plate. The anti-glare treatment aims at preventing such inhibition of visibility. The anti-glare treatment can be carried out, for example, by providing microscopic asperities on a surface of the transparent protective layer by a conventionally known method. Such microscopic asperities can be provided, for example, by roughening the surface by sand-blasting or embossing, or by blending transparent fine particles in the above-described transparent resin when forming the transparent protective layer.

The above-described transparent fine particles will be selected from, for example, silica, alumina, titania, zirconia, stannic oxide, indium oxide, cadmium oxide, antimony oxide and the solid solutions. The average diameter of the transparent fine particles is, for example, from 0.5 μm to 50 μm, through there is no particular limitation. Inorganic fine particles having electroconductivity can be used as well. Alternatively, the particles can be organic fine particles comprising, for example, crosslinked or uncrosslinked polymer particles. An amount of the transparent fine particles is from 2 weight parts to 50 weight parts, and generally, from 5 weight parts to 25 weight parts, for 100 weight parts of a transparent resin, though there is no particular limitation.

An anti-glare layer comprising the transparent fine particles can be provided, for example, as the transparent protective layer. Alternatively, a coating layer applied onto the transparent protective layer surface. The anti-glare layer can function as a diffusion layer to diffuse light transmitted through the polarizing plate in order to enlarge viewing angles.

The above-mentioned layers such as the antireflection layer, the diffusion layer and the anti-glare layer can be laminated on the polarizing plate, as an sheet of optical layers comprising these layers, separately from the transparent protective layer.

The above-described polarizer can be adhered to the transparent protective layer in a conventionally known method without any particular limitations. In general, adhesives including pressure-sensitive adhesives can be used, and the adhesive can be selected appropriately, e.g., depending on the kinds of the polarizing films and the transparent protective layers. Specifically, the adhesive or the pressure-sensitive adhesive can be based on PVA, modified PVA, and urethane-based polymer. The adhesive or the like can contain a water-soluble crosslinking agents such as boric acid, borax, glutaraldehyde, melamine, oxalic acid, chitin, chitosan, metal salt, and an alcohol-based solvent, for crosslinking vinyl alcohol-based polymers. Specifically, a PVA-based adhesive is preferably used for a polarizer of a PVA-based film in view of its adhesion stability. Though the thickness of the adhesive layer is not limited particularly, for example, it ranges from 1 nm to 500 nm, preferably from 10 nm to 300 nm, and more preferably from 20 nm to 100 nm.

In a case where the polarizer and the transparent protective layers are adhered by the adhesive, drying treatment is performed preferably in order to, for example, prevent peeling due to influences of humidity and heat and provide a polarizing plate being excellent in light transmittance and polarization degree. The drying temperature can be determined suitably corresponding to the kinds of the adhesive or pressure-sensitive adhesive in use, without any particular limitations. When the adhesive is a water-soluble adhesive such as PVA-based, modified PVA-based, urethane-based or the like as mentioned above, for example, the preferred drying temperature ranges from 60 to 75° C., more preferably from 60 to 70° C. The drying time is preferably about 1 to 10 minutes.

Figure 2:
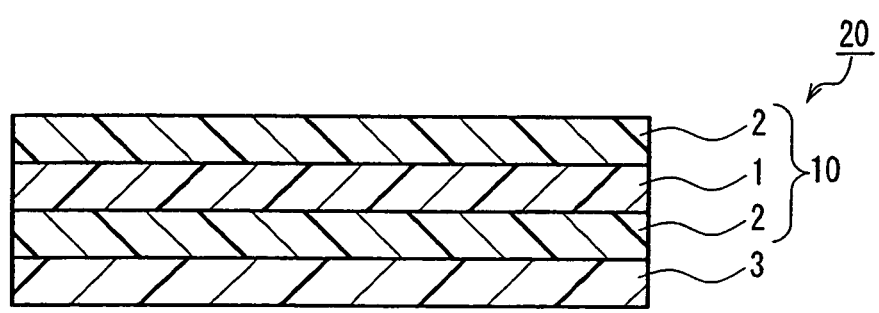
FIG. 2 is a cross-sectional view showing another example of an optical film of the present invention.

It is also preferable that the polarizing plate of the present invention has further a pressure-sensitive adhesive layer on the outermost surface so that lamination onto a liquid crystal cell or the like can be carried out easily. FIG. 2 is a cross-sectional view of a polarizing plate having such a pressure-sensitive adhesive layer. As shown in this figure, a polarizing plate 20 includes the polarizing plate 10 as shown in FIG. 1 and also a pressure-sensitive adhesive layer 3, and the pressure-sensitive adhesive layer 3 is arranged on the surface of one of the transparent protective layers 2 on the polarizing plate 10.

The pressure-sensitive adhesive layer can be formed on the transparent protective layer by any methods, for example, a method of applying a solution or a melt of a pressure-sensitive adhesive directly onto a predetermined face of the transparent protective layer by expansion such as flow-expansion and coating so as to form a layer, or a method of forming the pressure-sensitive adhesive layer in a similar manner on a separator as mentioned below and transferring it onto a predetermined face of the transparent protective layer. Though such a pressure-sensitive adhesive layer can be formed on one of the surfaces of the polarizing plate as shown in FIG. 2, it is not for limitation but pressure-sensitive adhesive layers can be arranged on both the surfaces as required.

The pressure-sensitive adhesive layers can be formed by suitably using conventionally known pressure-sensitive adhesives based on, for example, acrylic, silicone, polyester, polyurethane, polyether, and rubbers. Use of a pressure-sensitive adhesive with low moisture absorption coefficient and excellent heat resistance is preferable particularly from aspects of prevention of foaming and peeling phenomena caused by moisture absorption, prevention of degradation of optical characteristics and warping of the liquid crystal cell caused by difference in the thermal expansion, and furthermore, formation of liquid crystal displays with high quality and excellent durability, and the like. Examples of the pressure-sensitive adhesives include pressure-sensitive adhesives based on acrylic, silicone, acrylic silicone, polyester, and heat-resistant rubbers or the like. Alternatively for example, a pressure-sensitive adhesive layer containing microparticles and exhibiting light-diffusion can be used.

When a surface of the pressure-sensitive adhesive layer on a surface of the polarizing plate is exposed, preferably, the pressure-sensitive adhesive layer is covered with a separator by the time the pressure-sensitive adhesive layer is used so that contamination will be prevented. The separator can be made of an appropriate thin sheet such as a transparent protective film by coating a peeling agent if required, and the peeling agent may be selected, for example, from a silicone-based agent, a long-chain alkyl-based agent, a fluorine-based agent, an agent comprising molybdenum sulfide or the like.

Though there is no particular limitation, it is preferable that the thickness of the pressure-sensitive adhesive layer is 5 to 35 μm for example, more preferably 10 to 25 μm, and particularly preferably 15 to 25 μm. When the thickness is set within this range, for example, even if the size of the polarizing plate changes, stress caused by the dimensional change can be relieved.

The polarizing plate of the present invention can be used for forming a liquid crystal cell and a liquid crystal display or the like. In such a case, for example, the polarizer can be cut (chip-cut) corresponding to the size of the liquid crystal cell or the like in a state being laminated with a transparent protective layer or the like. Alternatively, the polarizer can be cut and then bonded with a transparent protective layer.

Next, a second example of the optical film of the present invention is a laminate including either the polarizer of the present invention or the polarizing plate according to the first example, and also at least one of a polarization converter and a retardation film.

There is no particular limitation on the polarization converter, but it can be an element used for forming in general a liquid crystal display or the like, and the examples include an anisotropic reflective polarizer and an anisotropic light-scattering polarizer. These polarization converters can be used as a single layer, or at least two layers can be laminated. When two or more layers are used, the layers can be the same type or different from each other.

Among the polarization converters, the anisotropic reflective polarizer is preferably, for example, a composite of a cholesteric liquid crystal layer and a retardation plate, and the retardation plate exhibits retardation of 0.2 to 0.3 times, more preferably 0.25 times the wavelength included in a reflection band of the anisotropic reflective polarizer. It is particularly preferable that the cholesteric liquid crystal layer is an alignment film of a cholesteric liquid crystal polymer or a product including the alignment liquid crystal layer supported on a film base, which has a characteristic of reflecting either counterclockwise or clockwise circularly-polarized light while transmitting the other light. For such an anisotropic reflective polarizer, for example, products of Nitto Denko Corporation (trade name: PCF series) or the like can be used. The wavelength can be determined arbitrarily as long as it is within the reflection band of the anisotropic reflective polarizer. The cholesteric liquid crystal layer can be, for example, a multilayer film of a dielectric or a multilayer laminate of thin films different from each other in the refractive anisotropy, which transmits linearly-polarized light of a predetermined polarization axis while reflecting the other light. For such an anisotropic reflective polarizer, for example, DBEF series (trade name) or the like produced by 3M Co. can be used.

For the anisotropic reflective polarizer, a reflective grid polarizer is preferred as well. A specific example thereof is Micro Wires (trade name) or the like produced by Moxtek.

For the anisotropic light-scattering type polarizer, for example, DRPF (trade name) or the like produced by 3M Co, can be used.

Next, for a third example of the optical films of the present invention, the polarizer of the present invention, the polarizing plate according to the first example, or any of various polarizing plates as laminates including the laminate according to the second example, and various optical layers, can be used. Though there is no particular limitation, the optical layers can be optical layers used for forming a liquid crystal display or the like, for example, a reflective plate, a semitransparent reflective plate, a retardation plate including a λ plate or the like such as a half wavelength plate and a quarter wavelength plate, a viewing-angle compensation plate, and a brightness enhancement film as mentioned below. These optical layers can be used alone or can be combined with at least one of the other optical layers. For a polarizing plate including such optical layers, particularly, a polarizing plate or the like including a laminate of a reflective polarizing plate, a semitransparent reflective polarizing plate, an elliptically-polarizing plate, a circularly-polarizing plate, a viewing-angle compensating film and a brightness enhancement film, is preferred.

These polarizing plates will be described below.

First, an example of the reflective polarizing plate or the semitransparent reflective polarizing plate according to the present invention will be described. The reflective polarizing plate includes further a reflector, for example, laminated on the polarizing plate of the first example as mentioned above. The semitransparent reflective polarizing plate has further a semitransparent reflector laminated on the polarizing plate.

In general, such a reflective polarizing plate is arranged on a backside of a liquid crystal cell in order to make a liquid crystal display (reflective liquid crystal display) to reflect incident light from a visible side (display side). The reflective polarizing plate has some merits, for example, assembling of light sources such as backlight can be omitted, and thus the liquid crystal display can be thinned further.

The reflective polarizing plate can be formed in any conventionally known manner such as forming a reflector of metal or the like on one surface of the polarizing plate having the elastic modulus. Specifically for example, a transparent protective film of the polarizing plate is prepared by matting one surface (exposed surface) if required. On this surface, a foil comprising a reflective metal such as aluminum or a deposition film is applied to form a reflective polarizing plate.

An additional example of a reflective polarizing plate comprises the above-mentioned transparent protective film having a surface of a microscopic asperity due to contained fine particles, and also a reflector corresponding to the microscopic asperity. The reflector having a microscopic asperity surface diffuses incident light by irregular reflection so that directivity and glare can be prevented and irregularity in color tones can be controlled. This reflector can be formed by disposing a metal foil or a metal deposition film directly on a microscopic asperity surface of the transparent protective layer in any appropriate methods including deposition such as vacuum deposition, and plating such as ion plating and sputtering.

Alternatively, the reflector can be used as a reflective sheet formed by providing a reflective layer onto a proper film similar to the transparent protective film. Since a typical reflective layer of a reflector is made of a metal, it is preferable in use of the reflector that the reflecting surface of the reflective layer is coated with a film, a polarizing plate or the like in order to prevent the reflection rate from reduction due to oxidation. As a result, the initial reflection rate is maintained for a long period, and a separate protective layer can be omitted.

A semitransparent polarizing plate is provided by replacing the reflector in the above-mentioned reflective polarizing plate by a transflector, and it is exemplified by a half mirror that reflects and transmits light at the reflective layer.

In general, such a semitransparent polarizing plate is arranged on a backside of a liquid crystal cell. In a liquid crystal display comprising the semitransparent polarizing plate, incident light from the visible side (display side) is reflected to display an image when the liquid crystal display is used in a relatively bright atmosphere, while in a relatively dark atmosphere, an image is displayed by using a built-in light source such as a backlight in the backside of the semitransparent polarizing plate. In other words, the semitransparent polarizing plate can be used to form a liquid crystal display that can save energy for a light source such as a backlight under a bright atmosphere, while a built-in light source can be used under a relatively dark atmosphere.

The following explanation is about an elliptically-polarizing plate or a circularly-polarizing plate formed by laminating a retardation plate or λ plate on a polarizing plate as in the above-mentioned first example.

The above-described elliptically-polarizing plate is effective in compensating (preventing) colors (for example, blue or yellow) generated due to birefringence in a liquid crystal layer of a super twist nematic (STN) liquid crystal display so as to provide a black-and-white display free of such colors. An elliptically-polarizing plate with controlled three-dimensional refractive index is preferred further since it can compensate (prevent) colors that will be observed when looking a screen of the liquid crystal display from an oblique direction. The circularly-polarizing plate is effective in adjusting color tones of an image of a reflective liquid crystal display that has a color image display, and the polarizing plate serves to prevent reflection as well.

The retardation plate is used for modifying linearly-polarized light to either elliptically-polarized light or circularly-polarized light, modifying either elliptically-polarized light or circularly-polarized light to linearly-polarized light, or modifying a polarization direction of linearly-polarized light. For example, a retardation plate called a quarter wavelength plate (λ/4 plate) is used for modifying linearly-polarized light to either elliptically-polarized light or circularly-polarized light, and for modifying either elliptically-polarized light or circularly-polarized light to linearly-polarized light. A half wavelength plate (λ/2 plate) is used in general for modifying a polarization direction of linearly-polarized light.

Examples of the retardation plates include birefringent films, alignment films of liquid crystal polymers, and laminates of alignment layers of liquid crystal polymers supported by the films. The birefringent films can be prepared by stretching films of any suitable polymers such as polycarbonate, PVA, polystyrene, polymethyl methacrylate, polyolefins including polypropylene, polyalylate, polyamide, and polynorbornene.

The retardation plate can have a retardation suitable for intended uses such as compensation of a viewing angle (e.g., widening of viewing angle) and compensation of coloring caused by birefringence of the liquid crystal layer, or plates having varied wavelengths such as a half wavelength plate and a quarter wavelength plate. Alternatively, the retardation plate can be an incline-alignment film having a refractive index controlled in the thickness direction. Two or more kinds of retardation plates can be laminated for forming a laminate with controlled optical characteristics such as the retardation.

The incline-alignment film is produced, for example, by adhering a heat shrinkable film onto a polymer film and stretching and/or shrinking the polymer film under an influence of a shrinking force provided by the heat, or by aligning obliquely a liquid crystal polymer.

The polarizing plate described below comprises an additional viewing-angle compensating film laminated on the polarizing plate of the first example.

The viewing-angle compensating film is used for widening a viewing angle so that an image can be clear relatively when a screen of a liquid crystal display is seen not in a direction perpendicular to the screen but in a slightly oblique direction. Such a viewing-angle compensating film can be a triacetylcellulose film coated with a discotic liquid crystal, or a retardation plate. While an ordinary retardation plate is a birefringent polymer film that is stretched uniaxially in the face direction, a retardation plate used for an viewing-angle compensating film is a two-way stretched film such as a birefringent polymer film stretched biaxially in the face direction and an incline-alignment polymer film with controlled birefringence in the thickness direction that is stretched uniaxially in the face direction and stretched also in the thickness direction. The incline-alignment film is prepared by, for example, adhering a heat shrinkable film to a polymer film and stretching and/or shrinking the polymer film under an influence of a shrinkage force provided by heat, or by aligning obliquely a liquid crystal polymer. A polymer as a material of the retardation plate is similar to the polymer used for the above-mentioned retardation plate.

A polarizing plate described below includes further a brightness enhancement film laminated on the polarizing plate of the first example.

Generally, this polarizing plate is arranged on a backside of a liquid crystal cell in use. When natural light enters, by reflection from a backlight or a backside of a liquid crystal display etc., the brightness enhancement film reflects linearly-polarized light of a predetermined polarizing axis or circularly-polarized light in a predetermined direction while the same film transmits other light. It allows entrance of light from a light source such as a backlight so as to obtain transmitted light in a predetermined polarization state, while reflecting light other than light in the predetermined polarization state. Light that is reflected at this brightness enhancement film is reversed through a reflector or the like arranged additionally behind the brightness enhancement film. The reversed light that re-enters the brightness enhancement film is transmitted partly or entirely as light in a predetermined polarization state, so that light transmitting the brightness enhancement film is increased and polarized light that is hardly absorbed in the polarizing film (polarizer) is supplied. As a result, quantity of light available for the liquid crystal display etc. can be increased to enhance brightness. When light enters through a polarizer from the backside of a liquid crystal cell by using a backlight or the like without using any brightness enhancement films, most light is absorbed in the polarizer but not transmitted by the polarizer if the light has a polarization direction inconsistent with the polarization axis of the polarizer. Depending on characteristics of the polarizer, about 50% of light is absorbed in the polarizer, and this decreases quantity of light available in the liquid crystal display or the like and makes the image dark. The brightness enhancement film repeatedly prevents light having a polarization direction to be absorbed in the polarizer from entering the polarizer, and reflects the light on the brightness enhancement film, reverses the light through a reflective layer or the like arranged behind, and makes the light re-enter the brightness enhancement plate. Since the polarized light that is reflected and reversed between them is transmitted only if the light has a polarization direction to pass the polarizer, light from a backlight or the like can be used efficiently for displaying images of a liquid crystal display in order to provide a bright screen.

A diffusion plate can also be provided between the brightness enhancement film and a reflective layer such as the above-described reflector. Polarized light reflected by the brightness enhancement film is directed to the reflector. The diffusion plate diffuses the passing light uniformly and at the same time, it cancels the polarization so as to provide a depolarized state. Namely, the diffusion plate converts the light back into its original state as natural light. This depolarized light, i.e., natural light is directed to the reflector, reflected at the reflector, and it passes again the diffusion plate so as to re-enter the brightness enhancement film. The state of natural light is recovered by repeating this series of actions. Thereby, the diffusion plate serves to maintain brightness of the display screen and decrease irregularity in the brightness. That is, a display screen having uniform brightness can be obtained by providing a diffusion plate for recovering natural light, since the diffusion plate has a diffusion function and further it can increase appropriately the repeated reflection of the initial incident light.

Though there is no particular limitation, the brightness enhancement film is advantageously selected from a multilayer thin film of a dielectric or a multilayer lamination of thin films with varied refraction aeolotropy that transmits linearly-polarized light having a predetermined polarization axis while reflecting other light. An specific example that can be used for this is DBEF (trade name) or the like produced by 3M Co. Alternative examples include a cholesteric liquid crystal layer, more specifically, an alignment film of a cholesteric liquid crystal polymer or an alignment liquid crystal layer fixed onto a supportive substrate that reflects either clockwise or counterclockwise circularly-polarized light while transmitting other light. For the films, for example, PCF350 (trade name) produced by Nitto Denko Corporation and Transmax (trade name) produced by Merck and Co., Inc. or the like can be used.

Therefore, for a brightness enhancement film to transmit linearly-polarized light having a predetermined polarization axis, for example, the transmission light enters the polarizing plate by matching the polarization axis so that absorption loss due to the polarizing plate is controlled and the light can be transmitted efficiently. For a brightness enhancement film to transmit circularly-polarized light, i.e., a cholesteric liquid crystal layer, preferably, the transmission circularly-polarized light is converted to linearly-polarized light before entering the polarizing plate in an aspect of controlling of the absorption loss, though the circularly-polarized light can enter the polarizer directly. Circularly-polarized light can be converted to linearly-polarized light by using a quarter wavelength plate for a retardation plate.

A retardation plate having a function as a quarter wavelength plate in a wide wave range including a visible light region can be obtained, for example, by laminating a retardation layer functioning as a quarter wavelength plate for monochromatic light such as light having 550 nm wavelength and another retardation plate showing a separate optical retardation property (e.g., a retardation plate functioning as a half wavelength plate). Therefore, a retardation plate arranged between a polarizing plate and a brightness enhancement film can comprise a single layer or at least two layers of retardation layers. A cholesteric liquid crystal layer also can be provided by combining layers different in the reflection wavelength and it can be configured by laminating two or at least three layers. As a result, the obtained retardation plate can reflect circularly-polarized light in a wide wavelength range including a visible light region, and this can provide transmission circularly-polarized light in a wide wavelength range.

Any of the above-mentioned various polarizing plates according to the third example can be an optical film made by laminating the polarizing plate and two or at least three optical layers. In other words, the polarizing plate can be a reflective polarizing plate or a semitransparent polarizing plate for elliptically-polarized light, which is prepared by combining either the above-mentioned reflective polarizing plate or a semitransparent polarizing plate with a retardation plate.

An optical film comprising a laminate of at least two optical layers can be formed in a method of laminating layers separately in a certain order for producing a liquid crystal display or the like. Since an optical film that has been laminated previously has excellent stability in quality and assembling operability, efficiency in producing a liquid crystal display can be improved. Any appropriate adhesion means such as a pressure-sensitive adhesive layer can be used for laminating the polarizing plate and optical layers.

The above-described layers composing the optical film of the present invention, such as a polarizing film, a transparent protective film, an optical layer, a pressure-sensitive adhesive layer or the like, can have ultraviolet absorption power as a result of treatment with an ultraviolet absorber such as an ester salicylate compound, a benzophenone compound, a benzotriazole compound, a cyanoacrylate compound, and a nickel complex salt compound.

Next, a liquid crystal panel of the present invention includes at least one of the polarizer of the present invention and an optical film (hereinafter, referred to as 'optical film)', which is arranged on at least one surface of the liquid crystal cell.

Regarding a liquid crystal cell, any of conventionally known liquid crystal cells can be used suitably without any particular limitations. Since the polarizer or the like of the present invention is useful for a liquid crystal display that allows polarized light to enter a liquid crystal cell so as to display, for example, liquid crystal cells using TN (twist nematic) liquid crystal or STN (supertwist nematic) liquid crystal are preferred. In addition, it can be used for liquid crystal cells of IPS (In-Plane switching), VA (Vertical Aligned), or OCB (Optically Compensated Birefringence) mode, which use non-twist liquid crystal, a guest-host base liquid crystal having a dichroic dye dispersed in a liquid crystal, a ferroelectric liquid crystal or the like are suitable as well. Similarly, there is no particular limitation about the system for driving the liquid crystal.

The optical films such as the polarizing plates can be arranged on only one of the surfaces of the liquid crystal cell, or they can be arranged on both the surfaces. The optical films arranged on both the surfaces can be the same type or different from each other. When polarizing plates or optical members are arranged on both surfaces of a liquid crystal cell, the polarizing plates or the optical members on the surfaces can be the same or can be varied.

Moreover, one or at least two layers of ordinary members such as a prism array sheet, a lens array sheet, and a light-diffusion plate can be arranged at proper positions.

Figure 3:
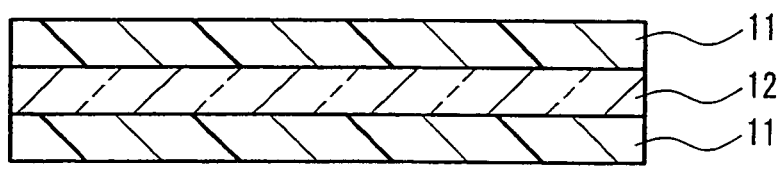
FIG. 3 is a cross-sectional view showing an example of a liquid crystal panel of the present invention.
Figure 4:
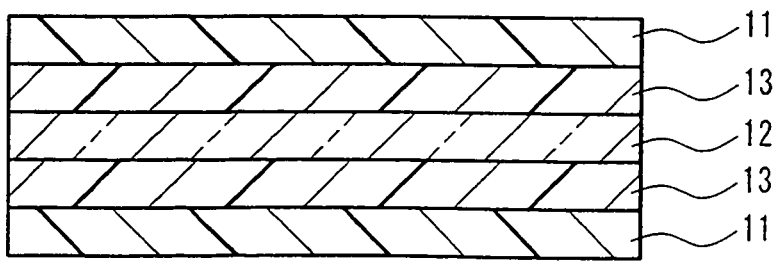
FIG. 4 is a cross-sectional view showing another example of a liquid crystal panel of the present invention.
Figure 5A:
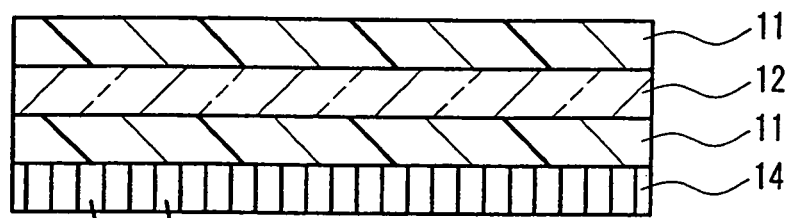
In FIG. 5, (A) is a cross-sectional view showing a further example of a liquid crystal panel of the present invention, while (B) and (C) are cross-sectional views showing parts of (A).
Figure 5B:
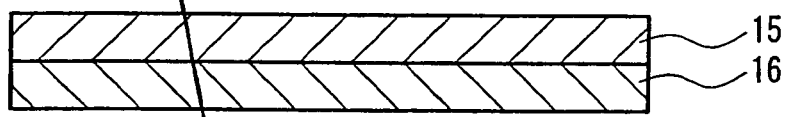
Figure 5C:

FIGS. 3-5 show an example of a liquid crystal panel in which the optical film of the present invention is arranged. These figures show cross sections of a liquid crystal cell and an optical film in a laminated state, and they are hatched for distinguish the components from each other. In the respective figures, common components are provided with same numbers. The liquid crystal panel of the present invention will not limited to the example.

The liquid crystal panel in FIG. 3 has a liquid crystal cell 12 and polarizing plates 11, where the polarizing plates 11 are arranged respectively on both the surfaces of the liquid crystal cell 12. There is no particular limitation on the structure (not shown) of the liquid crystal cell, generally, a liquid crystal is held between an array substrate and a filter substrate.

The liquid crystal panel in FIG. 4 has a liquid crystal cell 12, polarizing plates 11 and retardation plates 13, where the polarizing plates 11 are laminated on both the surfaces of the liquid crystal cell 12 via the retardation plates 13. Alternatively, the retardation plates 13 and the polarizing plates 11 can be arranged, as integrated optical films according to the present invention, on both the surfaces of the liquid crystal cell 12.

The liquid crystal panel in FIG. 5(A) includes a liquid crystal cell 12, polarizing plates 11 and a polarization converter 14, where the polarizing plates 11 are laminated respectively on both the surfaces of the liquid crystal cell 12 and the polarization converter 14 is further laminated on one surface of one of the polarizing plates. Elements as mentioned above can be used for the polarization converter 14, and the examples include a composite of a quarter wavelength plate 15 and a cholesteric liquid crystal 16 as shown in (B), and an anisotropic multilayer thin film reflective polarizer 17 as shown in (C). Alternatively the polarizing plates 11 and the polarization converter 14 can be arranged, as an integrated optical film according to the present invention, on one surface of the liquid crystal cell 12.

Next, a liquid crystal display of the present invention is a liquid crystal display including a liquid crystal panel, and the liquid crystal panel is of the present invention. This liquid crystal display can include a light source further. Though there is no particular limitation for the light source, a flat light source that emits polarized light is preferred for example, since the light energy can be used effectively.

For the liquid crystal display according to the present invention, it is also possible to further arrange a diffusion plate, an anti-glare layer, an anti-reflection film, a protective layer/plate, on an optical film (polarizing plate) at the viewing side. Alternatively, a retardation plate or the like for compensation can be arranged appropriately between a liquid crystal cell and a polarizing plate in the liquid crystal panel.

Next, an electroluminescent (EL) display of the present invention has at least one of the polarizer of the present invention and the optical film of the present invention. This EL display can be an organic EL display or an inorganic EL display.

Recently, for EL displays, use of an optical film such as a polarizer or a polarizing plate together with a λ/4 plate is suggested for preventing reflection from an electrode in a black state. The polarizer and the polarizing film of the present invention are useful particularly when any of linearly-polarized light, circularly-polarized light or elliptically-polarized light is emitted from the EL layer, or when obliquely emitted light is polarized partially even if natural light is emitted in the front direction.

The following description is about a typical organic EL display. In general, an organic EL display has a luminant (organic EL luminant) that is prepared by laminating a transparent electrode, an organic luminant layer and a metal electrode in this order on a transparent substrate. Here, the organic luminant layer is a laminated body of various organic thin films. Known examples thereof include a laminate of a hole injection layer made of triphenylamine derivative or the like and a luminant layer made of a fluorescent organic solid such as anthracene; a laminate of the luminant layer and an electron injection layer made of perylene derivative or the like; or a laminate of the hole injection layer, the luminant layer and the electron injection layer.

In general, the organic EL display emits light on the principle of a system of applying a voltage to the transparent electrode and the metal electrode so as to inject holes and electrons into the organic luminant layer, energy generated by the re-bonding of these holes and electrons excites the fluorescent material, and the excited fluorescent material emits light when it returns to the basis state. The re-bonding mechanism of the holes and electrons is similar to that of an ordinary diode. Current and the light emitting intensity exhibit a considerable nonlinearity accompanied with a rectification with respect to the applied voltage.

It is preferred for the organic EL display that at least one of the electrodes is transparent so as to obtain luminescence at the organic luminant layer. In general, a transparent electrode of a transparent conductive material such as indium tin oxide (ITO) is used for the anode. Use of substances having small work function for the cathode is effective for facilitating the electron injection and thereby raising luminous efficiency, and in general, metal electrodes such as Mg—Ag, and Al—Li may be used.

In an organic EL display configured as described above, it is preferable that the organic luminant layer is made of a film that is extremely thin such as about 10 nm. Therefore, the organic luminant layer can transmit substantially whole light as the transparent electrode does. As a result, when the layer does not illuminate, a light beam entering from the surface of the transparent substrate and passing through the transparent electrode and the organic ruminant layer before being reflected at the metal layer comes out again to the surface of the transparent substrate. Thereby, the display surface of the organic EL display looks like a mirror when viewed from exterior.

The organic EL display according to the present invention includes, for example, the organic EL luminant formed by providing a transparent electrode on the surface of the organic luminant layer and a metal electrode on the backside of the organic ruminant layer, and preferably, an optical film (e.g., polarizing plate) according to the present invention is arranged on the surface of the transparent electrode. More preferably, a λ/4 plate is arranged between the polarizing plate and an EL device. By arranging the polarizing film of the present invention, the organic EL display has an effect of suppressing external reflection and improving visibility. It is also preferable that an additional retardation plate is arranged between the transparent electrode and the polarizing film.

The retardation plate and the optical film (e.g., a polarizing plate) function to polarize light which enters from outside and is reflected by the metal electrode, and thus the polarization has an effect that the mirror of the metal electrode cannot be viewed from exterior. Particularly, the mirror of the metal electrode can be blocked completely by forming the retardation plate with a quarter wavelength plate and adjusting an angle formed by the polarization direction of the retardation plate and the polarizing plate to be π/4. That is, the polarizing plate transmits only the linearly-polarized light constituent among the external light entering the organic EL display. In general, the linearly-polarized light is changed into elliptically-polarized light by the retardation plate. When the retardation plate is a quarter wavelength plate and when the angle of the polarization direction provided by the polarizing plate and the retardation plate is π/4, the light is changed into circularly-polarized light.

Generally, this circularly-polarized light passes through the transparent substrate, the transparent electrode, and the organic thin film. After being reflected by the metal electrode, the light passes again through the organic thin film, the transparent electrode and the transparent substrate, and turns into linearly-polarized light at the retardation plate. Moreover, since the linearly-polarized light crosses the polarization direction of the polarizing plate at a right angle, it cannot pass through the polarizing plate. As a result, the mirror of the metal electrode can be blocked completely.

An in-house production method for the liquid crystal display of the present invention and an EL display includes subjecting at least either the polarizer of the present invention or the optical film of the present invention to a chip-cut and immediately bonding it to the display device, where the polarizer of the present invention has a surface-protective film on the display side while having a pressure-sensitive adhesive layer and a peeling layer on the other side.

In such an in-house production method of producing various display devices by conducting collectively the cutting of the polarizer and the optical film and the bonding to the liquid crystal cell or the like, for example, a prompt measurement is required for detecting a defective area, and also it is required to determine markings by setting a boundary sample or by an in-line measurement. According to the production method of the present invention, it is possible for the polarizer of the present invention or the optical film, that any parts not satisfying the above condition (1) is marked and punched out and then immediately bonded to a liquid crystal panel or to an EL display so as to produce various display devices. In this manner, since the processes from punching of the polarizer or the optical film, classification to bonding can be performed collectively and the time for inspection can be decreased, the production is facilitated, and the cost can be reduced. Here, the term 'in-house' denotes in general a collective line including punching of a polarizing plate in a rolled state, inspecting, and bonding to a LCD.

EXAMPLES

The following is a further description of the present invention by way of Examples and Comparative Examples. It should be noted that the present invention is not limited to these Examples alone.

A polarizer was produced by subjecting a PVA film to a swelling treatment, a dying treatment, a crosslinking treatment, a stretching treatment and a washing treatment according to the conditions as indicated in the Table 1 below, and a polarizing plate was produced by using the polarizer. Then, performance of the polarizer and the polarizing plate was evaluated. The PVA films used were a PVA film having a polarization degree of 2400 (a product of Kuraray Co., Ltd., with a trade name of VF-PS#7500, the width being 600 mm) and a PVA film having a polarization degree of 2600 (a product of the Nippon Synthetic Chemical Industry Co., Ltd., with a trade name of OPLM-7500, the width being 600 mm). Types of the PVA films used in the respective Examples and Comparative Examples are shown depending on the polarization degrees in the Table 1 below. The thickness and the thickness fluctuation of the PVA films (untreated films) are also shown in Table 1.

A. Production of Polarizer (1) Swelling Treatment

A PVA film was subjected to a swelling treatment under the condition as shown in Table 1 below. Specifically, the PVA film was impregnated in a water bath (swelling bath) and stretched. Table 1 indicates impregnation time, temperature of the swelling bath, and stretch rate with respect to an unswelled PVA film (untreated film). Here, a guide roll was used for improving the drainage in the swelling bath (hereinafter, the same).

(2) Dyeing Treatment

The PVA film was pulled out of the swelling bath, impregnated in an aqueous solution (dyebath) containing 0.03 wt % of iodine, and further stretched. Impregnation time, temperature of the dyebath and a stretch rate with respect to the length of the untreated film are shown in Table 1 below.

(3) Crosslinking Treatment

The PVA film was pulled out of the dyebath, impregnated in an aqueous solution (crosslinking bath) containing boric acid and KI, and further stretched. Impregnation time, temperature of the crosslinking bath, a stretch rate with respect to the length of the untreated film, and concentrations of boric acid and KI in the crosslinking bath are shown in Table 1 below.

(4) Stretching Treatment

The PVA film was pulled out of the crosslinking bath, impregnated in an aqueous solution (stretching bath) containing boric acid and KI, and further stretched. Impregnation time, temperature of the stretching bath, a stretch rate with respect to the length of the untreated film, and concentrations of boric acid and KI in the stretching bath are indicated in Table 1 below. Time of impregnating in the stretching bath (time for the stretching treatment) is also indicated in Table 1.

(5) Washing Treatment

The PVA film was pulled out of the stretching bath, impregnated in a KI aqueous solution (washing bath) and washed with water. KI concentration in the washing bath and the temperature of the washing bath are indicated in Table 1 below.

(6) Drying Treatment

After being washed in water, the PVA film was subjected to a drying treatment at 25° C. for 3 minutes, thereby a polarizer was obtained. For the thus obtained polarizer, relative values of the width and the thickness were calculated respectively with respect to the original width as 100% and the original thickness as 100%. The results also are shown in Table 1.

TABLE 1

| | Untreated film | | | Swelling | | | Dyeing | | | Crosslinking | | | |
|---|---|---|---|---|---|---|---|---|---|---|---|---|---|
| | Po. | Th. (μm) | Fl. (%/cm) | Time (sec.) | Rate | Tem. (° C.) | Time (sec.) | Rate | Tem. (° C.) | Time (sec.) | Rate | Tem. (° C.) | Con. |
| Example 1 | 2600 | 74-76 | 0.2 | 150 | 1.5 | 32 | 60 | 2.7 | 30 | 70 | 3.2 | 40 | Boric Acid 3% KI 5% |
| Com. Ex. 1 | 2600 | 49-51 | 0.3 | 150 | 1.5 | 32 | 60 | 2.7 | 30 | 70 | 3.2 | 40 | Boric Acid 3% KI 5% |
| Example 2 | 2600 | 74-76 | 0.3 | 150 | 1.5 | 32 | 60 | 2.7 | 30 | 70 | 3.2 | 40 | Boric Acid 3% KI 1% |
| Example 3 | 2600 | 72-78 | 0.4 | 150 | 1.5 | 32 | 60 | 2.7 | 30 | 70 | 3.2 | 40 | Boric Acid 3% KI 5% |
| Example 4 | 2400 | 73-77 | 1.1 | 100 | 1.5 | 32 | 60 | 2.7 | 30 | 70 | 3.2 | 40 | Boric Acid 3% KI 5% |
| Example 5 | 2600 | 74-76 | 0.3 | 45 | 2.5 | 32 | 60 | 3.1 | 30 | 70 | 3.4 | 40 | Boric Acid 3% KI 5% |
| Example 6 | 2600 | 74-76 | 0.3 | 80 | 2.1 | 32 | 60 | 3.1 | 30 | 70 | 3.4 | 40 | Boric Acid 3% KI 5% |
| Example 7 | 2600 | 74-76 | 0.3 | 50 | 1.5 | 32 | 60 | 3.1 | 30 | 70 | 3.4 | 40 | Boric Acid 3% KI 5% |
| Com. Ex. 2 | 2600 | 74-76 | 0.3 | 150 | 1.5 | 32 | 60 | 2.7 | 30 | 15 | 3.2 | 40 | Boric Acid 3% KI 5% |
| Com. Ex. 3 | 2400 | 73-77 | 1.1 | 40 | 2.8 | 32 | 35 | 3.2 | 30 | 15 | 3.5 | 40 | Boric Acid 3% KI 2% |

| | Stretching | | | | Washing | | Relative value | |
|---|---|---|---|---|---|---|---|---|
| | Time (sec.) | Rate | Tem. (° C.) | Con. | Con. | Tem. (° C.) | Width (%) | Th. (%) |
| Example 1 | 45 | 6.2 | 60 | Boric Acid 4% KI 5% | KI 1% | 25 | 41.5 | 38.9 |
| Com. Ex. 1 | 45 | 6.2 | 60 | Boric Acid 4% KI 5% | KI 1% | 25 | 41.6 | 38.8 |
| Example 2 | 45 | 6.2 | 60 | Boric Acid 4% KI 1% | KI 1% | 25 | 41.5 | 38.9 |
| Example 3 | 45 | 6.2 | 60 | Boric Acid 4% KI 5% | KI 1% | 25 | 41.5 | 38.9 |

TABLE 1-continued

|  |  |  |  |  |  |  |  |
|---|---|---|---|---|---|---|---|
| Example 4 | 45 | 6.2 | 60 | Boric Acid 4% KI 5% | KI 1% | 25 | 41.4 | 39.0 |
| Example 5 | 45 | 6.2 | 60 | Boric Acid 4% KI 5% | KI 1% | 25 | 41.4 | 39.0 |
| Example 6 | 45 | 6.2 | 60 | Boric Acid 4% KI 5% | KI 1% | 25 | 41.5 | 38.9 |
| Example 7 | 45 | 6.2 | 60 | Boric Acid 4% KI 5% | KI 1% | 25 | 41.5 | 38.9 |
| Com. Ex. 2 | 30 | 6.2 | 60 | Boric Acid 4% KI 5% | KI 1% | 25 | 51.0 | 31.6 |
| Com. Ex. 3 | 20 | 6.2 | 60 | Boric Acid 4% KI 2% | KI 4% | 25 | 51.0 | 31.6 |

Com. Ex: Comparative Example
Po.: Polarization degree
Th.: Thickness
Fl.: Fluctuation
Tem.: Temperature
Con.: Concentration B. Production of Polarizing Plate A TAC film (trade name: KC4UVX2MW) produced by Konica Corp. was impregnated previously in a 40° C. aqueous solution containing 5 wt % NaOH for 2 minutes, washed in 30° C. pure water for 1 minute, and further dried at 100° C. for 2 minutes, so that a saponified protective film (thickness: 40 µm) was produced. In a measurement of the retardation of this protective film, by using a retardation meter (trade name: KOBRA21ADH produced by Oji Scientific Instruments), the in-plane retardation was 1 nm, and the thickness-direction retardation was 27 nm (measurement wavelength: 550 nm). The protective films were bonded to both the surfaces of the polarizer by using a 3 wt % aqueous solution of PVA, and a drying treatment (65° C., 5 minutes) was carried out so as to produce a polarizing plate.

C. Method for Evaluating the Performance (1) Measurement of Retardation

The in-plane retardation of the polarizing plate was measured (measurement wavelength: 1000 nm) by using KOBRA-31PR (trade name; produced by Oji Scientific Instruments). Specifically, measurement was carried out at 12276 points in total at a pitch of 2 mm within the plane of a polarizing plate 250 mm in length and 200 mm in width. The results are shown in Table 2, as a retardation fluctuation range of the polarizing plate.

Retardations at adjacent measurement points are substituted in the equation below so as to calculate the differential retardation fluctuation ($\sigma$) (number of the calculated fluctuation 'n'=12054). In the formulae below, d is 2 mm. These results are shown in Table 2, as a differential retardation fluctuation range of the polarizing plate.

$$\sigma = \Delta R / d$$

$$\Delta R = R_i - R_{i+1}$$

Among the obtained in-plane retardations, a difference between the maximum retardation and the minimum retardation, and also a distance between the measurement point exhibiting the maximum retardation and the measurement point exhibiting the minimum retardation were calculated. The results are shown in Table 2.

(2) Measurement of Transmittance

Transmittance was measured by means of a spectral transmittance meter (trade name; DOT-3C produced by Murakami Color Research Laboratory), and denoted as a Y-value whose visibility was corrected in view of two-degrees-visual field (light source C) according to JIS Z 8701.

(3) Measurement of Polarization Degree

A polarization degree was obtained by calculating a measurement result of transmittance ($H_0$ and $H_{90}$) in accordance with the method for measuring transmittance, and by using the following formula. $H_0$ denotes a transmittance obtained by laminating two polarizing films so that the polarizing axes become parallel, while $H_{90}$ denotes a transmittance obtained by laminating two polarizing films so that the polarizing axes become perpendicular to each other. The parallel transmittance ($H_0$) and the perpendicular transmittance ($H_{90}$) are Y values corrected in the visibility as mentioned above.

$$\text{Polarization Degree}(\%) = \sqrt{\frac{H_0 - H_{90}}{H_0 + H_{90}}} \times 100$$

(4) Measurement of Single Hue, Parallel Hue and Crossed Hue

A single hue 'a', a single hue 'b', a parallel hue 'a', a parallel hue 'b', a crossed hue 'a' and a crossed hue 'b' were measured by using an integrating-sphere spectral transmittance meter (trade name DOT-3C; manufactured by Murakami Color Research Laboratory). The results are shown in Table 2 below.

(5) Method for Evaluating Display Irregularity

Each of the polarizing plates obtained in Examples and Comparative Examples was cut to a piece of 25 cm (length)×20 cm (width), which was then bonded to a surface of a high-contrast type IPS liquid crystal cell (light source side) via a pressure-sensitive adhesive, while SEG1425DU (trade name, produced by Nitto Denko Corporation) was bonded to the other surface (visible side) of the liquid crystal cell. The thus obtained liquid crystal panel was disposed on any of the backlights (A-D) described below, so that the (manufactured) polarizing plate of the liquid crystal panel at the light source side faces downwards. The liquid crystal panel was observed in the front direction (0°) and in the oblique directions (30°, 60°) on the visible side, and irregularities at the time of black display was evaluated on the basis of the evaluation criteria mentioned below. The results are shown in Table 3 below.

(Backlight A)

Figure 6:
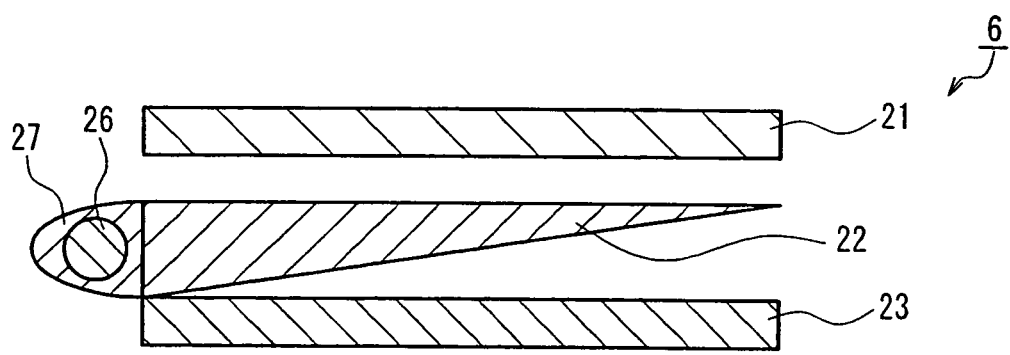
FIG. 6 is a cross-sectional view showing one example of a backlight in an Example of the present invention.

FIG. 6 is a schematic cross-sectional view showing a backlight A. As shown in this figure, this backlight 6 includes a wedge-shaped light-guiding plate 22 with a printed back face, to which a cold cathode ray tube 26 and a lamp house 27 were provided, and a diffusion plate 21 and a diffusion-reflection plate 23 are arranged respectively on the upper and lower surfaces thereof.

(Backlight B)

Figure 7:
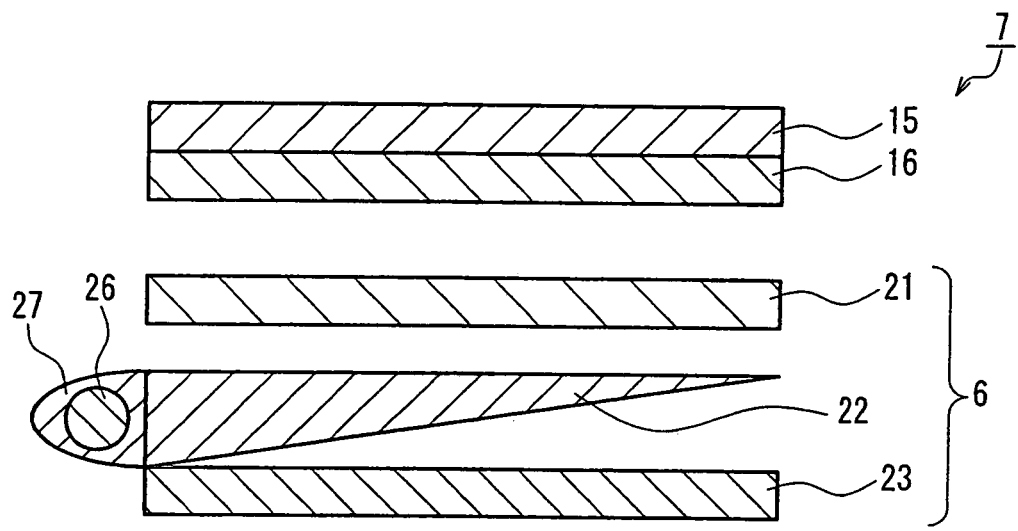
FIG. 7 is a cross-sectional view showing another example of a backlight in an Example of the present invention.

FIG. 7 is a schematic cross-sectional view of a backlight B. As shown in this figure, this backlight 7 is made by arranging a laminate of a cholesteric layer and a λ/4 plate, on the backlight 6 shown in FIG. 6. The laminate was arranged so that the cholesteric face (16) would face the backlight 6 while the λ/4 plate (15) would face the visible side. When arranging the liquid crystal cell on this backlight 7 as mentioned above, adjustment would be carried out for maximizing the quantity of transmitted light. The laminate of the cholesteric layer and the λ/4 plate was prepared by eliminating only the polarizing plate from PCF400TEG (trade name) produced by Nitto Denko Corporation.

(Backlight C)

Figure 8:
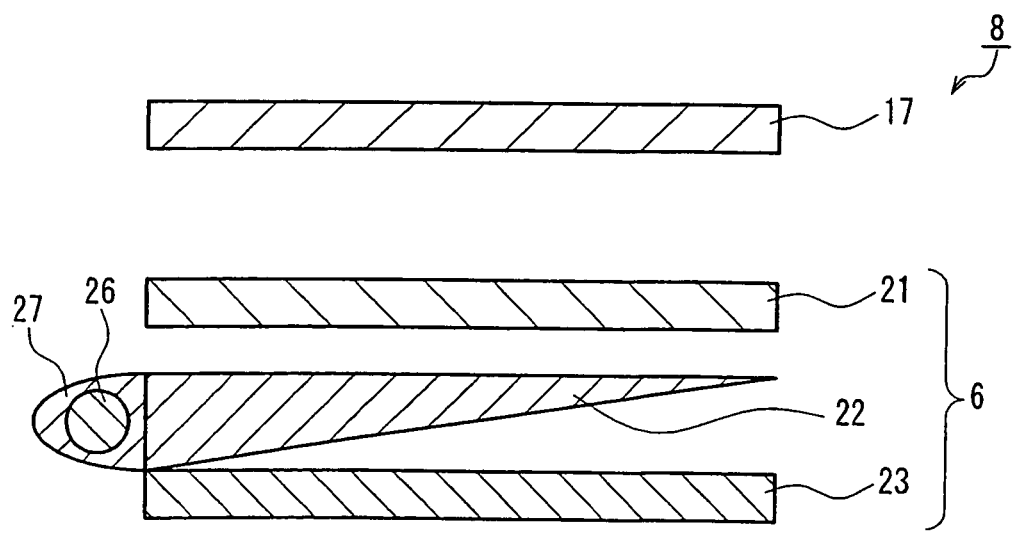
FIG. 8 is a cross-sectional view showing another example of a backlight in an Example of the present invention.

FIG. 8 is a schematic cross-sectional view showing a backlight C. As shown in this figure, this backlight 8 is made by arranging an anisotropic multilayer thin film reflective polarizer 17 (trade name: DBEF, produced by 3M Co.) on the backlight 6 as shown in FIG. 6. When arranging the liquid crystal cell on this backlight 8 as mentioned above, adjustment would be carried out for maximizing the quantity of transmitted light.

(Backlight D)

Figure 9A:
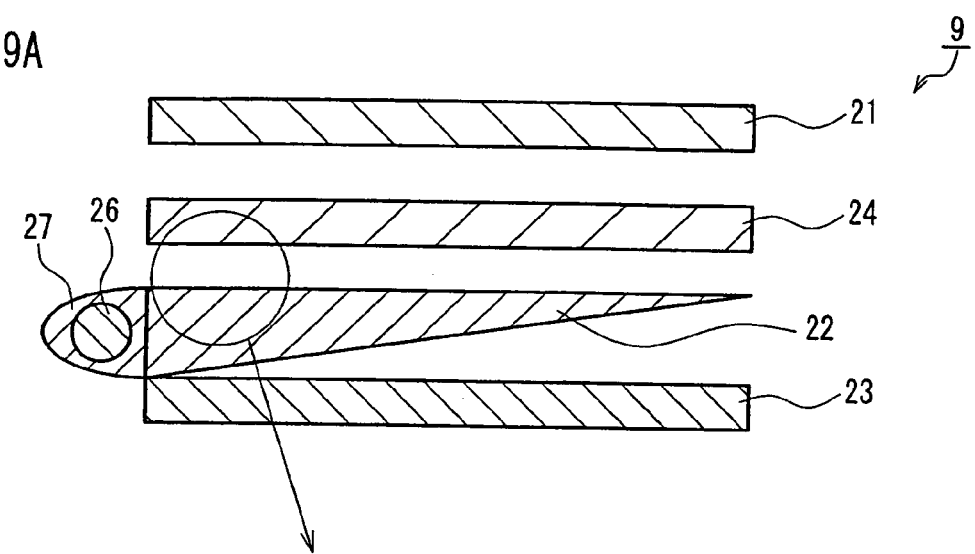
In FIG. 9, (A) is a cross-sectional view showing another example of a backlight in an Example, and (B) is a partial and schematic view of (A).
Figure 9B:
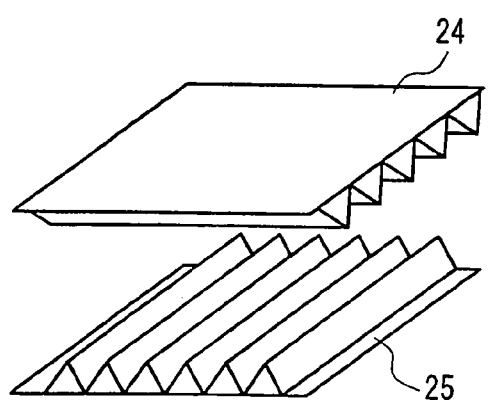

In FIG. 9, (A) is a schematic cross-sectional view of a backlight D, and (B) is a schematic and partial view of (A). As shown in the figure, this backlight 9 is formed by providing a cold cathode ray tube 26 and a lamp house 27 on a wedge-shaped light-guiding plate 25 formed with prisms on the light-emitting surface, and a diffusion-reflection plate 23 and prism sheet 24 were arranged on the lower and upper surfaces of the light-guiding plate 25. As shown in the enlarged view of (B) showing a part of (A), the prism sheet 24 was arranged so that its prism face would face the prism face of the light-guiding plate 25. And a diffusion plate 21 was further arranged on the upper surface of the prism sheet 24.

(Evaluation Criteria)

5: Display irregularities were not recognized at all.

4: Display irregularities were not recognized at all while a fluorescent lamp was turned on; a slight irregularity was recognized while light was turned off (dark room).

3: Display irregularities were not recognized at all while a fluorescent lamp was turned on; irregularities were recognized while light was turned off (dark room).

2: A slight irregularity was recognized while a fluorescent lamp was turned on.

1: Display irregularities were recognized clearly while a fluorescent lamp was turned on.

TABLE 3

| | Backlights | | | | | | | | | | | |
|---|---|---|---|---|---|---|---|---|---|---|---|---|
| | A | | | B | | | C | | | D | | |
| | 0° | 30° | 60° | 0° | 30° | 60° | 0° | 30° | 60° | 0° | 30° | 60° |
| Example 1 | 5 | 5 | 5 | 5 | 5 | 5 | 5 | 5 | 5 | 5 | 5 | 5 |
| Com. Ex. 1 | 4 | 3 | 2 | 2 | 2 | 1 | 2 | 2 | 1 | 3 | 2 | 2 |
| Example 2 | 5 | 4 | 3 | 4 | 3 | 3 | 4 | 3 | 3 | 4 | 4 | 3 |
| Example 3 | 5 | 4 | 3 | 4 | 3 | 3 | 4 | 3 | 3 | 4 | 3 | 3 |
| Example 4 | 4 | 4 | 3 | 3 | 3 | 2 | 3 | 3 | 2 | 4 | 3 | 2 |
| Example 5 | 4 | 4 | 3 | 3 | 2 | 2 | 3 | 2 | 2 | 4 | 3 | 2 |
| Example 6 | 4 | 4 | 3 | 3 | 3 | 2 | 3 | 3 | 2 | 4 | 3 | 3 |
| Example 7 | 5 | 4 | 3 | 4 | 3 | 3 | 3 | 3 | 2 | 4 | 3 | 3 |
| Com. Ex. 2 | 3 | 2 | 2 | 2 | 1 | 1 | 2 | 1 | 1 | 2 | 2 | 2 |
| Com. Ex. 3 | 2 | 2 | 1 | 1 | 1 | 1 | 1 | 1 | 1 | 2 | 1 | 1 |

As shown in Table 2, for the polarizers of Comparative Examples, the fluctuation ranges of the in-plane retardations at 1000 nm were out of the range of 950 to 1350 nm, and thus the evaluations of the display irregularities were inferior as shown in Table 3. On the contrary, the polarizing plates including the polarizers according to Examples and having fluctuations in a range of 950 to 1350 nm had excellent display characteristics as the display irregularities were suppressed. The results indicate that the polarizers of the present invention serve to provide various image display devices with suppressed display irregularities.

INDUSTRIAL APPLICABILITY

As mentioned above, by using the polarizer of the present invention as an optical film such as a polarizing plate for a liquid crystal panel, a liquid crystal display or the like, display irregularities are prevented and excellent display characteristics can be achieved. Moreover, according to the present invention, as the polarizer and the polarizing plate or the like can be marked by an in-line measurement, for example, off-line processes such as visual inspection and packing immediately after the cutting of the polarizer can be omitted, and this can realize an in-house production in which the polarizers will be bonded collectively to liquid crystal displays or EL display devices. In this manner, for example, the cost for the display devices can be reduced and the management of the production process can be facilitated, resulting in improvement from the industrial viewpoint.

TABLE 2

| | Polarizer | | | | | Polarizing plate | | | | | | |
|---|---|---|---|---|---|---|---|---|---|---|---|---|
| | Retardation | σ | Maximum/minimum. value | | Transmittance | | Single hue | | Parallel hue | | Crossed hue | |
| | (nm) | (nm/mm) | Pitch | Difference | (%) | Polarization degree | a | b | a | b | a | b |
| Example 1 | 1110-1150 | −2.4-2.1 | 17 cm | 28 nm | 43.9 | 99.98 | −1.1 | 2.4 | −1.8 | 4.2 | 0.1 | −1.5 |
| Com. Ex. 1 | 660-710 | −2.2-2.4 | 15 cm | 37 nm | 44.0 | 99.95 | −1.2 | 3.1 | −2.0 | 6.1 | 0.3 | −2.1 |
| Example 2 | 1110-1150 | −3.2-3.9 | 9 cm | 58 nm | 44.0 | 99.98 | −1.3 | 3.6 | −2.2 | 6.4 | 0.4 | −2.6 |
| Example 3 | 1110-1150 | −4.5-4.1 | 17 cm | 49 nm | 44.0 | 99.97 | −1.2 | 2.9 | −2.0 | 5.5 | 0.3 | −1.9 |
| Example 4 | 1120-1190 | −4.1-3.9 | 7 cm | 65 nm | 43.9 | 99.96 | −1.1 | 2.9 | −2.1 | 5.3 | 0.3 | −2.0 |
| Example 5 | 1190-1270 | −5.2-5.6 | 8 cm | 62 nm | 44.0 | 99.97 | −1.3 | 3.3 | −2.2 | 6.0 | 0.4 | −2.2 |
| Example 6 | 1010-1080 | −4.3-4.9 | 9 cm | 56 nm | 44.0 | 99.97 | −1.4 | 3.4 | −2.1 | 6.2 | 0.3 | −2.3 |
| Example 7 | 1060-1120 | −4.7-4.6 | 10 cm | 43 nm | 44.0 | 99.97 | −1.3 | 3.3 | −2.2 | 6.1 | 0.3 | −2.1 |
| Com. Ex. 2 | 790-870 | −3.2-3.4 | 9 cm | 39 nm | 44.0 | 99.95 | −1.2 | 3.7 | −2.2 | 6.7 | 0.6 | −2.9 |
| Com. Ex. 3 | 800-890 | −5.5-5.0 | 8 cm | 61 nm | 44.1 | 99.93 | −1.4 | 3.6 | −2.4 | 7.1 | 0.5 | −3.2 |

The invention claimed is:

1. A polarizer containing a dichroic material in a matrix, wherein an in-plane retardation at a measurement wavelength providing no absorption is in a range of 1120 to 1350 nm, and wherein a distance between a measurement position providing a maximum value of the in-plane retardation and a measurement position providing a minimum value of the in-plane retardation is more than 0 mm and not more than 10 mm or not less than 100 mm.

2. The polarizer according to claim 1, wherein a differential retardation fluctuation ($\sigma$) at the measurement wavelength providing no absorption is in a range of −5 nm/mm to 5 nm/mm.

3. The polarizer according to claim 1, wherein at the measurement wavelength providing no absorption, a difference between the maximum value and the minimum value (in-plane retardation variation) is less than 60 nm.

4. The polarizer according to claim 1, wherein the measurement wavelength is in a range of 800 to 1500 nm.

5. The polarizer according to claim 4, wherein the measurement wavelength is 1000 nm.

6. The polarizer according to claim 1, wherein the matrix is a polymer film.

7. The polarizer according to claim 6, wherein the polymer film is a polyvinyl alcohol film.

8. The polarizer according to claim 1, which is chip-cut.

9. An optical film comprising the polarizer according to claim 1.

10. The optical film according to claim 9, which further comprises a transparent protective layer, and the transparent protective layer is arranged on at least one surface of the polarizer.

11. The optical film according to claim 9, wherein a pressure-sensitive adhesive layer is arranged on at least one outermost surface layer.

12. The optical film according to claim 9, which further comprises at least either a polarization converter or a retardation film.

13. The optical film according to claim 12, wherein the polarization converter is either an anisotropic reflective polarizer or an anisotropic light-scattering polarizer.

14. A liquid crystal panel comprising at least the polarizer according to claim 1, wherein the polarizer is arranged on at least one surface of a liquid crystal cell.

15. A liquid crystal display comprising the liquid crystal panel according to claim 14.

16. The liquid crystal display according to claim 15, which has a flat light source for emitting polarized light.

17. An image display device comprising at least the polarizer according to claim 1.

18. The image display device according to claim 17, which is an electroluminescent display.

19. An in-house production method for producing the image display device according to claim 17, which comprises a process of chip-cutting at least a polarizer containing a dichroic material in a matrix, wherein an in-plane retardation at a measurement wavelength providing no absorption is in a range of 950 to 1350 nm, and immediately bonding to the display device.

20. A liquid crystal panel comprising at least the optical film according to claim 9, wherein the optical film is arranged on at least one surface of a liquid crystal cell.

21. A liquid crystal display comprising the liquid crystal panel according to claim 20.

22. The liquid crystal display according to claim 21, which has a flat light source for emitting polarized light.

23. An image display device comprising at least the optical film according to claim 9.

24. The image display device according to claim 23, which is an electroluminescent display.

25. An in-house production method for producing the image display device according to claim 17, which comprises a process of chip-cutting at least an optical film comprising a polarizer, the polarizer containing a dichroic material in a matrix, wherein an in-plane retardation at a measurement wavelength providing no absorption is in a range of 950 to 1350 nm, and immediately bonding to the display device.

* * * * *